US011070319B2

(12) United States Patent
Petkov et al.

(10) Patent No.: US 11,070,319 B2
(45) Date of Patent: Jul. 20, 2021

(54) METHOD AND DEVICE FOR TRANSMITTING BUILDING SERVICES DATA

(71) Applicant: DIEHL METERING SYSTEMS GMBH, Nuremberg (DE)

(72) Inventors: Hristo Petkov, Nuremberg (DE);
Thomas Lautenbacher, Erlangen (DE);
Thomas Kauppert, Nuremberg (DE);
Klaus Gottschalk, Winkelhaid (DE)

(73) Assignee: Diehl Metering Systems GmbH, Nuremberg (DE)

( * ) Notice: Subject to any disclaimer, the term of this patent is extended or adjusted under 35 U.S.C. 154(b) by 13 days.

(21) Appl. No.: 16/413,691

(22) Filed: May 16, 2019

(65) Prior Publication Data
US 2019/0273580 A1 Sep. 5, 2019

Related U.S. Application Data

(63) Continuation of application No. PCT/EP2017/001245, filed on Oct. 24, 2017.

(30) Foreign Application Priority Data

Nov. 16, 2016 (DE) .......................... 102016013653.7

(51) Int. Cl.
*H04L 1/08* (2006.01)
*H04L 1/20* (2006.01)
(Continued)

(52) U.S. Cl.
CPC ............ *H04L 1/08* (2013.01); *H03M 13/353* (2013.01); *H04L 1/0013* (2013.01); *H04L 1/203* (2013.01); *H04L 12/12* (2013.01)

(58) Field of Classification Search
CPC ..... H03M 13/353; H03M 13/356; H04L 1/08; H04L 1/0002
See application file for complete search history.

(56) References Cited

U.S. PATENT DOCUMENTS

| 4,905,234 A | * | 2/1990 | Childress | .............. H04L 1/1614 370/349 |
| 5,808,760 A | * | 9/1998 | Gfeller | ............... H04B 10/1143 340/13.24 |

(Continued)

FOREIGN PATENT DOCUMENTS

| EP | 2953275 A1 | 12/2015 |
| WO | 2015113664 A1 | 8/2015 |

OTHER PUBLICATIONS

A. R. G. e Silva and H. M. de Oliveira, "Adaptive repetition coding as a pseudorandom issue for WiMedia UWB-payload protection," 2009 IEEE Latin-American Conference on Communications, Medellin, 2009, pp. 1-4.*

(Continued)

*Primary Examiner* — Steve N Nguyen
(74) *Attorney, Agent, or Firm* — Laurence A. Greenberg; Werner H. Stemer; Ralph E. Locher

(57) ABSTRACT

Domestic data are transmitted in the form of data messages from a data source to a memory in an unsynchronized manner in time slots via a freely accessible and accordingly heavily used transmission channel. On account of the interfering influences on the long data messages which occur in this case, the transmission of the data messages must be repeated several times until a data message is received without interference once. A comparator is used to determine a packet error rate from the ratio of the number of data messages received without interference over a certain period to the number of data messages actually transmitted during the period. A predefined packet error rate can be adaptively (Continued)

complied with despite varying transmission circumstances by varying the repeated transmissions per unit time.

12 Claims, 2 Drawing Sheets

(51) Int. Cl.
    *H04L 12/12*     (2006.01)
    *H04L 1/00*     (2006.01)
    *H03M 13/35*     (2006.01)

(56) References Cited

U.S. PATENT DOCUMENTS

| | | | | |
|---|---|---|---|---|
| 5,818,826 A * | 10/1998 | Gfeller | | H04L 1/08 370/342 |
| 6,246,693 B1 * | 6/2001 | Davidson | | H04L 1/08 370/445 |
| 6,252,854 B1 * | 6/2001 | Hortensius | | H04L 1/08 370/252 |
| 2002/0167907 A1 * | 11/2002 | Sarkar | | H04W 52/48 370/252 |
| 2003/0156659 A1 * | 8/2003 | Hanaoka | | H04L 1/0066 375/298 |
| 2003/0162512 A1 * | 8/2003 | Lauterbach | | H04L 1/0026 455/120 |
| 2006/0221847 A1 * | 10/2006 | Dacosta | | H04W 28/22 370/252 |
| 2009/0257386 A1 * | 10/2009 | Achir | | H04L 25/14 370/329 |
| 2011/0044276 A1 * | 2/2011 | Albert | | H04L 1/1887 370/329 |
| 2011/0133894 A1 * | 6/2011 | Hennig | | H03J 3/20 340/10.1 |
| 2012/0201121 A1 * | 8/2012 | Huang | | H04L 1/1825 370/216 |
| 2012/0263107 A1 * | 10/2012 | Taghavi Nasrabadi | | H04L 1/0003 370/328 |
| 2013/0163543 A1 * | 6/2013 | Freda | | H04W 16/14 370/329 |
| 2013/0225922 A1 * | 8/2013 | Schentag | | A61B 1/303 600/109 |
| 2014/0045507 A1 * | 2/2014 | Bontu | | H04L 5/0094 455/450 |
| 2014/0176341 A1 * | 6/2014 | Bernhard | | H04W 56/00 340/870.02 |
| 2015/0373683 A1 | 12/2015 | Schliwa-Bertling et al. | | |
| 2016/0262109 A1 | 9/2016 | Chen et al. | | |

OTHER PUBLICATIONS

S. Pfletschinger, D. Declercq and M. Navarro, "Adaptive HARQ With Non-Binary Repetition Coding," in IEEE Transactions on Wireless Communications, vol. 13, No. 8, pp. 4193-4204, Aug. 2014.*

* cited by examiner

METHOD AND DEVICE FOR TRANSMITTING BUILDING SERVICES DATA

CROSS-REFERENCE TO RELATED APPLICATION

This application is a continuation, under 35 U.S.C. § 120, of copending international application No. PCT/EP2017/001245, filed Oct. 24, 2017, which designated the United States; this application also claims the priority, under 35 U.S.C. § 119, of German patent application DE 10 2016 013 653.7, filed Nov. 16, 2016; the prior applications are herewith incorporated by reference in their entirety.

BACKGROUND OF THE INVENTION

Field of the Invention

The present invention relates to a method for repeatedly transmitting domestic data and to a device for carrying out the method according to the invention.

European published patent application EP 2 953 275 A1 (commonly assigned) describes a radio transmission system in which a data source captures a sequence of consumption measured values by means of sensors. The respective digitized measured value or metering data record comprising the measured value, source identification and transmission add-ons is transmitted from the data source to a remotely operated storage system, or memory, in the form of a data message coded in an origin-related manner, using a bidirectional close-range data radio downlink. The data message is also referred to as a packet or data packet, and the memory, together with data processing, is also referred to as a concentrator or aggregator. Conversely, uplink information such as tariff change specifications can be transmitted from the memory to data sources and can be evaluated there. From the memory, the data messages coming from a plurality of data sources can be selectively buffered and possibly preprocessed, retrieved using wide-range radio, for instance in the mobile radio standard, and transmitted, directly by radio or by means of a storage medium, to a central point in which the data are evaluated, for example for the purpose of creating consumption bills.

The measured values or data which can be transmitted bidirectionally may be, for example, the consumption of cold and hot water, gas, heat or electricity, which is usually determined by sensors in situ on the basis of a meter. Furthermore, the data which can be transmitted bidirectionally may also be other domestic and telecontrol variables (in particular desired and actual values), such as the temperature in a room or the angular position of a ventilation flap.

The data messages may be transmitted completely or broken down into partial messages or partial data packets and, in that case, can be reassembled to form complete data messages at the receiving end. Such data transmissions are carried out in an unsynchronized manner in so-called time slots, for example as frequency modulation of a carrier in the VHF spectrum, but preferably in one of the ISM (Industrial, Scientific and Medical) and/or SRD (Short Range Devices) bands of the UHF spectrum which are not specifically licensed, and therefore with an instantaneous channel assignment which is not known a priori and which varies. Since it can therefore be expected that a data message received in the memory experiences interference during its transmission, with the result that it cannot be evaluated in the memory, the data message is repeatedly transmitted from the transmitter in the transceiver of the data source to the receiver in the transceiver of the memory at certain intervals in such a manner that interference-free reception can be expected at least once.

In metering technology, a certain so-called packet error rate (PER) which is ultimately overcome by the repeated transmissions must be accepted. The packet error rate (PER) represents the ratio of the number of successfully received data messages or partial messages to the known number of data messages or partial messages that were actually transmitted during the period. On the other hand, a certain up-to-dateness which, depending on the data content, may be minutes or hours to days is required for the data messages (packets); by then, a current, repeatedly transmitted data message must have been finally correctly captured in the memory with a sufficient degree of probability despite interfering influences in the transmission channel. This procedure makes frequent repetition of the transmitted data messages appear desirable. However, this may result in an unnecessary load of the transmission channel. In addition, the smallest possible number of repeated transmissions should be aimed for in order to avoid unnecessarily using, for example, the battery with its predefined functional life in the transmitter of the transceiver of the data source. Therefore, it may still be reasonable, at the beginning of the battery functional life, to firmly specify at least a number of repeated transmissions of the data message which is sufficient in any case according to experience to the controller of the transmitter; nevertheless, no more repeated transmissions than statistically required for the resulting correct transmission of a current data message should be carried out toward the end of the calculated battery functional life.

BRIEF SUMMARY OF THE INVENTION

It is accordingly an object of the invention to provide a method and a device for transmitting data which overcome the above-mentioned and other disadvantages of the heretofore-known devices and methods of this general type and which provide for the optimization of the number of repeated transmissions until a current data message is present in the memory without interference.

With the foregoing and other objects in view there is provided, in accordance with the invention, a data transmission method, comprising:

repeatedly transmitting domestic data in data messages from a data source to a memory via a transmission channel;

determining in a comparator a packet error rate for the data messages received over a time period, the packet error rate being a ratio of data messages received without interference to data messages transmitted in the time period; and changing a number of repetitions for future transmissions for impacting and specifying the packet error rate of the future transmissions.

In other words, the objects of the invention are achieved in that the current packet error rate PER (i.e., the ratio of successfully received data messages to data messages actually currently transmitted in the time period) is determined in a quasi-discontinuous or discontinuous manner in the memory, or storage system. The packet error rate can be set to a desired value by changing the number or frequency of the repeated transmissions for the current transmission circumstances (represented by the number of data messages received without interference). This repetition specification is transmitted from the memory to the respective data source in the uplink and is kept available in the memory for the next determination of the current packet error rate. The effective transmission circumstances are therefore kept constant by adaptively adapting the repeated transmissions for a packet error rate to be aimed for.

Each of the relatively long data messages can be expediently transmitted, in a manner known as such, in the form of individualized partial messages which are transmitted in succession and are grouped or assembled again in the memory to form the overall data message, rather than as a whole, in order to receive at least one data message without interference as quickly as possible in the memory or data collector. If it turns out in this case that a particular data message has interference, the interference generally actually relates only to a particular short partial message from the data message. Precisely this partial message will not have interference again during the subsequent reception of the repeated data message, with the result that, when this partial message is adopted into the preceding data message received with interference, a complete data message without interference is now available more quickly there than if it were necessary to wait for a repeated data message received completely without interference, with a corresponding increase in the value of the packet error rate which, in the sense defined above, extends between the values of zero and one.

With the above and other objects in view there is also provided, in accordance with the invention, a device for repeatedly transmitting domestic data via a transmission channel, the device comprising:

a data source having a sensor and a transceiver for repeatedly transmitting data messages from the data source via a transmission channel;

a memory having a transceiver and a comparator, said transceiver receiving the data messages via the transmission channel, and said comparator being configured to determine a packet error rate from a ratio of a number of data messages received without interference to a number of data messages transmitted within a given time period; and wherein a number of future repeated transmissions is derived from the packet error rate, and said transceiver of said memory is configured to transmit the number of future repeated transmissions to said transceiver of said data source.

The device is specifically configured to carry out the method as summarized above and as described hereinbelow.

Other features which are considered as characteristic for the invention are set forth in the appended claims.

Although the invention is illustrated and described herein as embodied in a method and device for transmitting domestic data, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
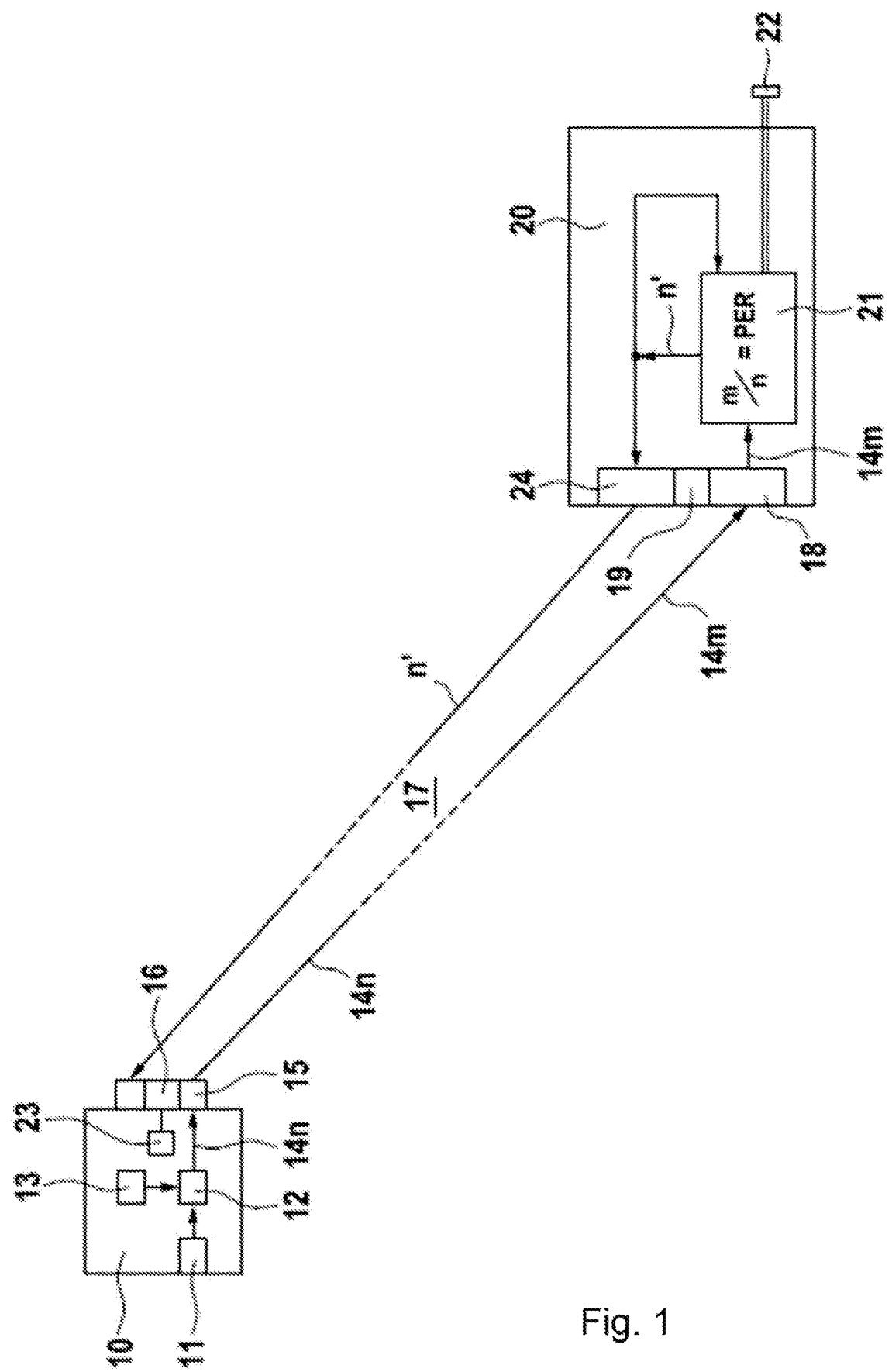
FIG. 1 shows a simplified schematic illustration of a data message transmission using the method according to the invention.

Referring now to the figures of the drawing in detail and first, particularly, to FIG. 1 thereof, the data provided by a sensor 11, which are typically in the form of analog data, are subjected to an A/D conversion in an A/D converter 12 by a plurality of data sources 10$i$ and are combined with further information, such as an origin identifier, a time stamp, a parity bit and/or the like, from a coder 13 in such a manner that a complete data message 14 is composed. The data message 14, which may also be referred to as a data packet or data telegram, is transmitted repeatedly, namely n times, over a certain period from a transmitter 15 in the source-side transceiver 16 to the receiver 18 of the transceiver 19 of a central memory 20, or central storage 20, using a transmission channel 17, for example a transmission channel with stochastic interference. Owing to the interfering influences, only m<n of the repeatedly transmitted data messages 14$n$ can be received without errors, that is to say in a manner which can be evaluated, for example. In the memory 20, a comparator 21 determines the packet error rate PER for the currently encountered transmission circumstances in the transmission channel 17 by determining the ratio m/n of the data messages 14$m$ received without errors to the system-known number n of data messages which are actually repeatedly transmitted over the period. The optimum would be the packet error rate PER=1 which actually cannot be achieved in practice on account of m=n. The comparator 21 can be expediently in the form of an apparatus inside the memory 20 and/or can be in the form of a pure software solution or software implementation.

In order to influence the packet error rate PER, the comparator 21 can change the number of future source-side emissions to n'. The sense in which and the extent to which the change is intended to turn out can be influenced or specified in a program-controlled, remotely controlled or direct manner in the memory 20 using an actuator in the form of a handle 22. A hardware controller or a pure software implementation can be provided, for example, as the handle 22. In practice, a value of the packet error rate PER which is as constant as possible despite varying transmission circumstances and can be specified in accordance with the desired up-to-dateness of the transmitted data messages is aimed for. This can be achieved or determined, for example, by varying the number of repetitions n.

In the case of n'>n in a predefined time period, the repetition frequency for emitting the data message 14 can be increased, that is to say the packet error rate is reduced, and vice versa. In any case, however, the repetition frequency of the emissions should be reduced by means of n'<n toward the end of the operating period of the battery 23 for the transceiver 16 order to protect the battery 23. The number of future repeated transmissions n' is transmitted from the transmitter 24 of the memory-side transceiver 19 to the controller of the source-side transmitter 15 in the uplink and is also held in the comparator 21 for the next determination of the packet error rate PER.

In a freely accessible and accordingly heavily used transmission channel 17, interfering influences generally occur and have an effect, in particular, on the data messages 14$n$ which are transmitted from a data source 10, for example, to a memory 20 in an unsynchronized manner in time slots.

Consequently, the respective data message 14 must be repeatedly transmitted several times until the data message 14m has been received without interference at least once. A comparator 21 is used to determine a packet error rate PER over a certain period from the ratio of the number m of data messages received without interference to the number n of data messages actually transmitted in the meantime 14m/14n. In the interests of optimized data up-to-dateness of the data messages 14m which do not have interference and are available for the memory 20, the number n' of future repeated transmissions per unit time, for example, is increased, that is to say the packet error rate PER is reduced according to that definition, and vice versa. The change in the number n=>n' of future repeated transmissions for achieving a particular predefined packet error rate PER in the current transmission circumstances can be influenced in a program-controlled or remotely controlled manner or manually in situ. According to the invention, the packet error rate PER can therefore be adaptively optimized by adapting the number of repeated transmissions n' to the current transmission circumstances because a corresponding number of repetitions n' can be specified to the data source 10 from the memory 20 in order to comply with a desired packet error rate PER despite varying transmission circumstances.

Figure 2:
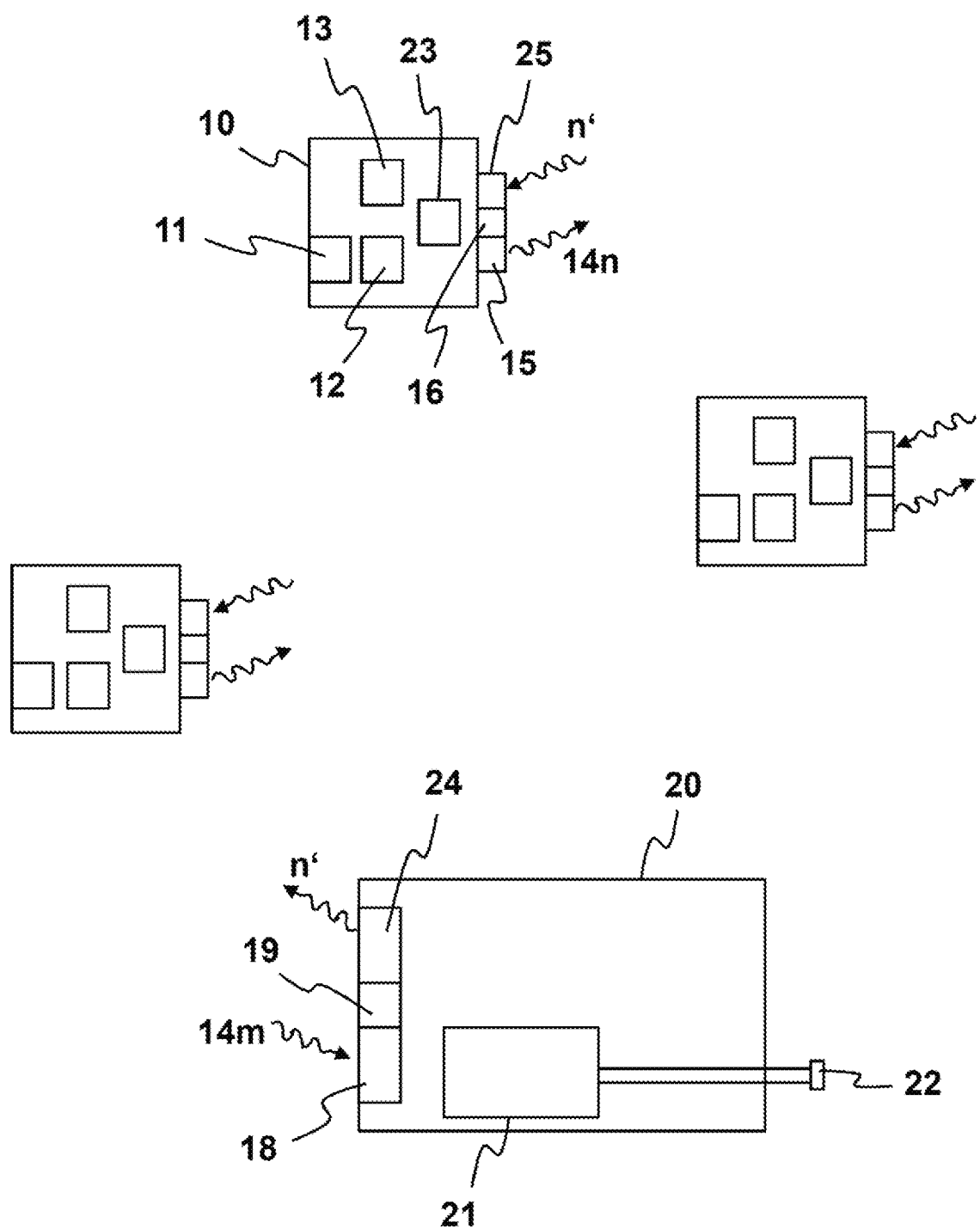
FIG. 2 shows a simplified schematic illustration of a communication system in which data messages are transmitted using the method according to the invention.

FIG. 2 illustrates a radio transmission system or communication system comprising a plurality of data sources 10 and a memory 20. The data sources 10 are in the form of consumption meters, for example in the form of water, gas, heat or electricity meters, which capture a current consumption and transmit same in the form of consumption data to the memory 20. The data sources 10 each comprise a sensor 11 for capturing the consumption data, for example an ultrasonic sensor for determining a flow rate of a consumption medium (for example water or gas), and a transceiver 16 with a transmitter 15 for transmitting and/or receiving the data messages or partial messages via the transmission channel 17, that is to say a bidirectional transmission channel. The memory 20 is in the form of a data collector or data concentrator with a transceiver 19 and is used to receive, collect and/or forward the data or consumption data. A device according to the invention for repeatedly transmitting domestic data, for example the consumption data, in particular, respectively comprises the sensor 11 and the transceiver 16 of the data source 10 as well as the transceiver 19 of the memory 20.

The consumption meters transmit the data to the data collector in a wireless manner, for example by radio, using unlicensed frequency bands, such as the ISM and/or SRD frequency bands. The consumption meters each comprise a transmitter 15 which must comply with restrictions in the case of transmission time and transmission period with regard to the energy consumption or the available energy, that is to say is dependent on the state of charge of the battery 23, for example. In addition to supplying the transceiver 16 with energy, the battery 23 may also be provided for the purpose of supplying the sensor 11 with energy in this case. The consumption meters transmit their data messages at regular intervals, wherein the data collector receives the data from the consumption meters which are within the reception range.

On account of transmissions using unlicensed frequency bands, the channel assignment is generally initially unknown and may also vary. As a result of the fact that the channel assignment is unknown, the data up-to-dateness which can be achieved is difficult to predict. For transmission, use is made, for example, of a method in which a data message is subdivided into a plurality of partial messages which are transmitted with temporal pauses (telegram splitting). The partial messages are then assembled again in the receiver, that is to say in the data collector, in particular.

In this method, the probability of the data being incorrectly transmitted as a result of interference caused by superimposition with other signals in the channel is calculated by means of the packet error rate PER which is formed from the number m of data messages and/or partial messages successfully received by the receiver, that is to say the memory 20 or data collector, to the number n of data messages and/or partial messages transmitted by the transmitter, that is to say the data source 10 or the respective consumption meter (PER=m/n). In this case, the probability p1 describes the probability of a partial message having interference and not being able to be correctly transmitted:

$$PER = p1^n$$

The packet error rate PER can be theoretically derived by completely rejecting, for example, a slot or a frequency channel if there is an interferer with a particular period t(interferer) in the slot with the period t(slot). The following applies to the probability p(slot) of the slot having interference:

$$p(\text{slot}) = 1 - e^{-[(t(slot) + t(interferer))/t(interferer)] \cdot channel\ assignment}$$

The probability p(all) of all slots being occupied is therefore calculated using the number of slots n(slots) using $$p(\text{all}) = PER = p(\text{slot})^{n(slots)}.$$

However, in the method according to the invention, the respective current packet error rate PER(actual) is preferably determined. The transmission interval of the consumption meters within the communication system is known and therefore the number of transmitted data messages within a particular period n(tx) is also known. In this case, the current packet error rate PER(actual) is determined from the number of actually received data messages n(Rx), that is to say the number of successfully received data messages at the data collector, and the known number of transmitted data messages:

$$PER(\text{actual}) = n(Rx)/n(tx)$$

Furthermore, the number n(actual) of currently transmitted partial messages is also known in the communication system, with the result that the current probability p(actual) of a channel assignment or channel interference can be calculated from the knowledge of PER(actual) and n(actual):

$$p(\text{actual}) = \sqrt[n(actual)]{PER(\text{actual})}$$

A desired or optimum PER(desired) can therefore be expediently determined. For an optimum PER(desired), the required number of emissions of the partial messages n(desired) can therefore be calculated:

$$n(\text{desired}) = \log(p(\text{actual})) \cdot PER(\text{desired})$$

The required number of emissions n(desired) can then be communicated to the data source 10 or the consumption meter via the return channel, that is to say from the collector 20 to the data source 10, in particular together with the command to transmit the data messages or partial messages in the number n(desired) to a receiver 25 of the transceiver 16 of the data source 10. This makes it possible to determine or set the desired packet error rate PER(desired).

In summary, the current packet error rate PER(actual) can therefore be determined from the knowledge of the predefined emissions using the method according to the invention. The number of transmissions of partial messages or partial packets which is required for the successful transmission (substantially without interference) of the data messages can be determined therefrom and is communicated to the data source 10 in order to adapt the number of transmissions. Consequently, the packet error rate PER is adaptively controlled by means of the method according to the invention by adapting or influencing the number of transmitted data messages or partial messages. The number of repeated transmissions until a current data message is respectively present in the memory 20 or data collector without interference despite the unavoidable variable interfering influences in the transmission channel can therefore be optimized in an advantageous manner.

The following is a summary list of reference numerals and the corresponding structure used in the above description of the invention:

10 Data source
11 Sensor
12 A/D converter
13 Coder
14 Data message
15 Transmitter (of 16 in 10)
16 Transceiver
17 Transmission channel
18 Receiver (of 19 in 20)
19 Transceiver
20 Memory
21 Comparator
22 Handle
23 Battery (for 15)
24 Transmitter (of 19 in 20)
25 Receiver (of 16 in 10)
PER Packet error rate
n Number
p Probability
t Period

The invention claimed is:

1. A data transmission method, comprising:
repeatedly transmitting domestic data in data messages from a transceiver of a data source to a memory via a transmission channel with stochastic interference in at least one of the ISM and/or SRD bands with an instantaneous channel assignment which is not known a priori and which varies;
determining in a comparator a packet error rate for the data messages received over a time period;
wherein a current packet error rate is determined for the current transmission circumstances;
changing a number of repetitions for future transmissions for specifying the packet error rate of the future transmissions so that a current, repeatedly transmitted data message is correctly captured in the memory with a sufficient degree of probability despite interfering influences in the transmission channel;
whereas the interference is caused by superimposition with other signals in the channel; and
whereas a number of repetitions for future transmissions via the transmission channel are calculated as a function of a desired packet error rate, a current packet error rate, and the number of currently transmitted messages, whereas the number of repetitions are stored in the comparator, and whereas the number of repetitions is transmitted to the transceiver of the data source.

2. The method according to claim 1, which comprises operating at least one of a transmitter and a sensor of the data source with power from a battery, and the number or the frequency of repetitions of future transmissions is reduced toward an end of an operating period of the battery.

3. The method according to claim 1, which comprises controlling the number of repetitions of future transmissions under program control, under remote control, or under manual control.

4. The method according to claim 1, which comprises transmitting and receiving successive data messages as partial messages, and replacing an incorrect partial message with a correct data message from one of the data messages which have already been repeatedly transmitted and received.

5. The method according to claim 1, which comprises specifying the packet error rate on a basis of a desired packet error rate, and using the desired packet error rate to determine a required number of emissions of the data messages or partial messages.

6. The method according to claim 1, which comprises determining a current packet error rate from a number of transmitted data messages within a given period n(tx) and a number of actually received data messages n(Rx), and changing a number of repetitions of future transmissions on a basis of the current packet error rate.

7. The method according to claim 1, wherein the comparator is an apparatus inside the memory and/or a software solution.

8. The method according to claim 1, wherein the transmission channel is a bidirectional transmission channel.

9. The method according to claim 1, wherein the data source is a consumption meter for determining the consumption of a supply medium, and/or the memory is a data collector or a data concentrator.

10. A device for repeatedly transmitting domestic data via a transmission channel, the device comprising:
a data source having a sensor and a transceiver for repeatedly transmitting data messages from the data source via a transmission channel;
a memory having a transceiver and a comparator, said transceiver receiving the data messages via the transmission channel, and said comparator being configured to determine a packet error rate;
wherein the current packet error rate is determined for the current transmission circumstances;
whereas a number of future repeated transmissions via the transmission channel are calculated as a function of a desired packet error rate, the current packet error rate, and the number of currently transmitted messages, whereas the number of future repeated transmissions are stored in the comparator, and whereas the number of future repeated transmissions is transmitted to the transceiver of the data source; and
whereas the interference is caused by superimposition with other signals in the channel and said transceiver of said memory is configured to transmit the number of future repeated transmissions to said transceiver of said data source.

11. The device according to claim 10, wherein said memory comprises a device for influencing the future number of repeated transmissions.

12. The device according to claim 11, wherein said device is configured for manual actuation, for remote control, and/or for program control by software.

* * * * *